United States Patent
Routh, Jr. et al.

(10) Patent No.: US 8,766,214 B2
(45) Date of Patent: Jul. 1, 2014

(54) METHOD OF PREPARING AND IMAGING A LAMELLA IN A PARTICLE-OPTICAL APPARATUS

(71) Applicant: FEI Company, Hillsboro, OR (US)

(72) Inventors: Brian Roberts Routh, Jr., Beaverton, OR (US); Peter Christiaan Tiemeijer, Eindhoven (NL); Bart Jozef Janssen, Eindhoven (NL); Thomas G. Miller, Portland, OR (US); David Foord, Portland, OR (US); Ivan Lazić, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/919,656

(22) Filed: Jun. 17, 2013

(65) Prior Publication Data
US 2014/0007307 A1     Jan. 2, 2014

Related U.S. Application Data

(60) Provisional application No. 61/666,178, filed on Jun. 29, 2012.

(30) Foreign Application Priority Data

Jul. 26, 2012  (EP) .................................. 12178060

(51) Int. Cl.
*H01J 37/26* (2006.01)
*H01J 37/28* (2006.01)
*H01J 37/295* (2006.01)

(52) U.S. Cl.
CPC ............... *H01J 37/295* (2013.01); *H01J 37/26* (2013.01); *H01J 37/28* (2013.01)
USPC .................. 250/492.21; 250/492.2; 250/310; 250/311

(58) Field of Classification Search
CPC ......... H01J 37/26; H01J 37/28; H01J 37/295; H01J 37/2067; G01T 1/2914; G01N 23/205; G01N 23/225
See application file for complete search history.

(56) References Cited

U.S. PATENT DOCUMENTS

| | | | |
|---|---|---|---|
| 7,586,093 B2 | 9/2009 | Feuerbaum | |
| 7,792,246 B2 * | 9/2010 | Rodenburg et al. | 378/43 |

(Continued)

FOREIGN PATENT DOCUMENTS

| | | |
|---|---|---|
| JP | 2012138283 | 7/2012 |
| WO | 2012090670 | 7/2012 |

OTHER PUBLICATIONS

Liu, Cheng, et al., "Influence of thick crystal effects on ptychographic image reconstruction with moveable illumination." Ultramicroscopy, Sep. 1, 2009, pp. 1263-1275, vol. 109.

(Continued)

*Primary Examiner* — David A Vanore
(74) *Attorney, Agent, or Firm* — Scheinberg & Associates, PC; Michael O. Scheinberg

(57) ABSTRACT

The invention relates to a method of preparing and imaging a sample using a particle-optical apparatus, equipped with an electron column and an ion beam column, a camera system, a manipulator. The method comprises the steps of deriving a first ptychographic image of the sample from a first electron image, thinning the sample, and forming a second ptychographic image of the sample. In an embodiment of the invention the seed image used for the second image is the first ptychographic image. In another embodiment the second ptychographic image is the image of the layer removed during the thinning. In another embodiment the inner potential of the sample is determined and dopant concentrations are determined.

20 Claims, 2 Drawing Sheets

(56) References Cited

U.S. PATENT DOCUMENTS

| | | | |
|---|---|---|---|
| 8,040,521 B2* | 10/2011 | Pfaff | 356/457 |
| 8,592,764 B2* | 11/2013 | von Harrach et al. | 250/311 |
| 8,624,184 B1* | 1/2014 | Souza et al. | 250/307 |
| 2003/0006373 A1* | 1/2003 | Koguchi et al. | 250/311 |
| 2007/0057182 A1* | 3/2007 | Feuerbaum | 250/310 |
| 2010/0004773 A1* | 1/2010 | Kochergin | 700/103 |
| 2012/0217391 A1* | 8/2012 | Shichi et al. | 250/306 |
| 2013/0223685 A1* | 8/2013 | Maiden | 382/103 |
| 2013/0313428 A1* | 11/2013 | Buijsse | 250/307 |
| 2013/0327952 A1* | 12/2013 | Maazouz et al. | 250/396 R |
| 2014/0007307 A1* | 1/2014 | Routh et al. | 850/3 |

OTHER PUBLICATIONS

Humphry, MJ, et al., "Ptychographic electron microscopy using high-angle dark-field scattering for sub-nanometre resolution imaging." Nature Communications., Mar. 6, 2012, 7 pgs, vol. 3.

\* cited by examiner

METHOD OF PREPARING AND IMAGING A LAMELLA IN A PARTICLE-OPTICAL APPARATUS

This Application claims priority from U.S. Provisional Application No. 61/666,178, filed Jun. 29, 2012, which is hereby incorporated by reference.

The invention relates to a method preparing and imaging a sample using a particle-optical apparatus, the particle-optical apparatus equipped with an electron column mounted on an evacuable sample chamber, the electron column equipped to produce a beam of electrons, the beam of electrons for irradiating the sample, a camera system for forming an electron image of the diffraction pattern caused by electrons transmitted through the sample, a manipulator for positioning the sample in the sample chamber with respect to the beam of electrons, the method comprising the steps of: preparing the sample, positioning the sample in the sample chamber with respect to the beam of electrons, forming an electron image on the camera system using the electron column, and deriving a first ptychographic image of the sample from said first electron image, the ptychographic image the result of an iterative converging process in which estimates of the sample are formed.

Such a method is known from U.S. Pat. No. 7,792,246 B2. Practical results using this techniques are published in "Ptychographic electron microscopy using high-angle dark-field scattering for sub-nanometer resolution imaging", M. J. Humphry et al., Nature Communications, published Mar. 6, 2012, DOI: 10.1038/ncomms1733, further referred to as Humphry [-1-]

Humphry [-1-] describes how a thin sample can be imaged in a Scanning Electron Microscope (SEM) equipped with a CCD camera for capturing the diffraction pattern of electrons transmitted through the sample. The SEM is equipped to produce a beam of electrons, in this example a beam of 30 keV electrons, and comprises an objective lens for focusing the beam and deflectors to scan the beam over the sample. The beam is not focused on the sample, but an underfocus is used resulting in a focus approximately 3 µm more removed from the objective lens, resulting in a beam diameter of approximately 20-40 nm at the sample. The electrons passing through the sample form a diffraction image on the camera. A number of diffraction patterns are acquired of overlapping areas of the sample. The diffraction patterns show information to a radius of at least 0.236 $nm^{-1}$ The diffraction images are used to form a ptychographic image of the sample by using the algorithm described in U.S. Pat. No. 7,792,246 B2, more specifically its FIG. 7 and associated text. The resultant ptychographic image shows a resolution of 0.236 nm atomic plane fringes (see Humphry [-1-], FIG. 4).

It is noted that this is significantly better than the attainable resolution of 1.2 nm of the SEM when focusing the beam to a spot onto the sample, the resolution limited by the diameter of the spot.

A disadvantage of the known method is that the sample must be thinned and then has to be inserted into the SEM. Oxidation, or at least surface modification, is likely to occur.

Another disadvantage is that, when the sample is too thick, it must be taken out and thinned further.

Yet another disadvantage is that it is difficult to obtain images of samples less than 20 nm thick. Especially the handling and transporting of such samples is difficult and often results in damage or loss of the sample. Observation of such thin samples might be important as semiconductor sizes are shrinking below said limit.

The invention intends to provide a solution to these problems.

To that end the method according to the invention is characterized in that:
- the particle-optical apparatus comprises a focused ion beam column mounted on the sample chamber for producing a focused ion beam, the focused ion beam for machining the sample,
- Preparing the thin sample involves positioning the sample with respect to the ion beam and thinning the sample using the focused ion beam,
- After forming the first image, a layer of the sample is removed using the ion beam, and using the electron column a second electron image is formed, and
- a second ptychographic image of the sample is formed after removing the layer of the sample,
- the sample is kept under vacuum at least from the moment that the sample is prepared by thinning the sample with the focused ion beam until the moment that the second electron image is taken.

By in situ thinning, imaging and further thinning and observing the sample, without exposing the sample to air, or exposing it to a more inert atmosphere like nitrogen, the chances that the sample's surface is changed (modified) are minimized. Also, as the sample is not removed from the vacuum chamber when thinning it, very thin samples of for example less than 20 nm can be made and imaged without encountering the problems associated with e.g. re-inserting the sample in the vacuum chamber.

It is noted that, as the sample is not removed from the sample chamber but preferably in constant contact with the manipulator, the position of the sample is typically known to an accuracy of several microns or better, enabling quick localization of the area of interest (the area of the sample that is imaged). Should the sample be removed from the manipulator, then the position of the area of interest in the apparatus is lost and finding said area after re-attachment of the sample to the manipulator is a time consuming process.

In an embodiment of the invention the first ptychographic image or one of the guesses in the iterative process for forming the first ptychographic image other than the first guess is used as a seed image for the reconstruction of the second ptychographic image, thereby shortening the throughput time needed for forming the second ptychographic image from the second electron image.

By using the first image (or one of its predecessors) as a seed in the iterative process used for forming the second ptychographic image, the number of iterations needed for obtaining the second image will be less, thus resulting in an improved throughput time.

Also a computer generated image can be used as a seed image.

In another embodiment of the invention a reconstructed ptychographic image of the removed layer is formed using the first and second ptychographic images or using the first and second electron images.

In this way an image of the removed layer is made. As the removed layer can be as thin as e.g. 3-5 nm, an image of a very thin layer is made.

It is noted that slight artifacts may occur due to implantation damage. Therefore the use of a beam that does not leave implanted atoms is preferred. Also the damage of the atomic order in the newly formed surface layer (knock-on damage or the forming of an amorphous layer) may introduce artifacts.

In still another embodiment of the invention one of the images is used to determine the place dependent phase shift in the lamella and derive from that the inner potential of the lamella as a function of the position, followed by the step of deriving dopant concentrations.

As known to the skilled artisan doping a material, for example a semiconductor, results in a change of the inner potential of said material. A change in inner potential results in a phase shift of electrons transmitted through the material. As ptychography can show phase information of an image, t is also possible to show the doping differences between parts of the sample.

It is noted that for this method it is not necessary to remove layers, and that this embodiment can in principle be used to determine the dopant concentrations in a thin lamella without further thinning.

In still another embodiment of the invention the second image is used to determine an end-pointing decision.

End pointing decisions are made when determining when a structure in the sample comes to the surface, or to determine the thickness of the sample.

In still another embodiment of the invention the ion beam is a focused ion beam that can be scanned over the sample.

Thinning the sample by scanning a finely focused ion beam parallel to the surface of the sample is a well-known technique.

In still another embodiment of the invention the material of the sample semiconductor material, a crystalline material, a polycrystalline material, or a biological material at a cryogenic temperature.

Biological samples at a cryogenic temperature are preferred when studying biological materials such as cells, bacteria, or parts thereof: the use of cryogenic temperatures enables to study them without chemical alterations like embedding, infiltrating, etc.

In still another embodiment of the invention the method further comprises forming multiple ptychographic images of the lamella, the multiple images formed with the lamella in a different orientation with respect to the electron beam, followed by 3D-reconstruction of a tomogram of the lamella.

The invention is now elucidated using figure, in which identical reference numerals refer to corresponding features.

BRIEF DESCRIPTION OF THE DRAWINGS

To that end:

FIG. 1 shows an apparatus 100 comprising an evacuable sample chamber 102, that can be evacuated by a vacuum pump (not shown).

Figure 1:
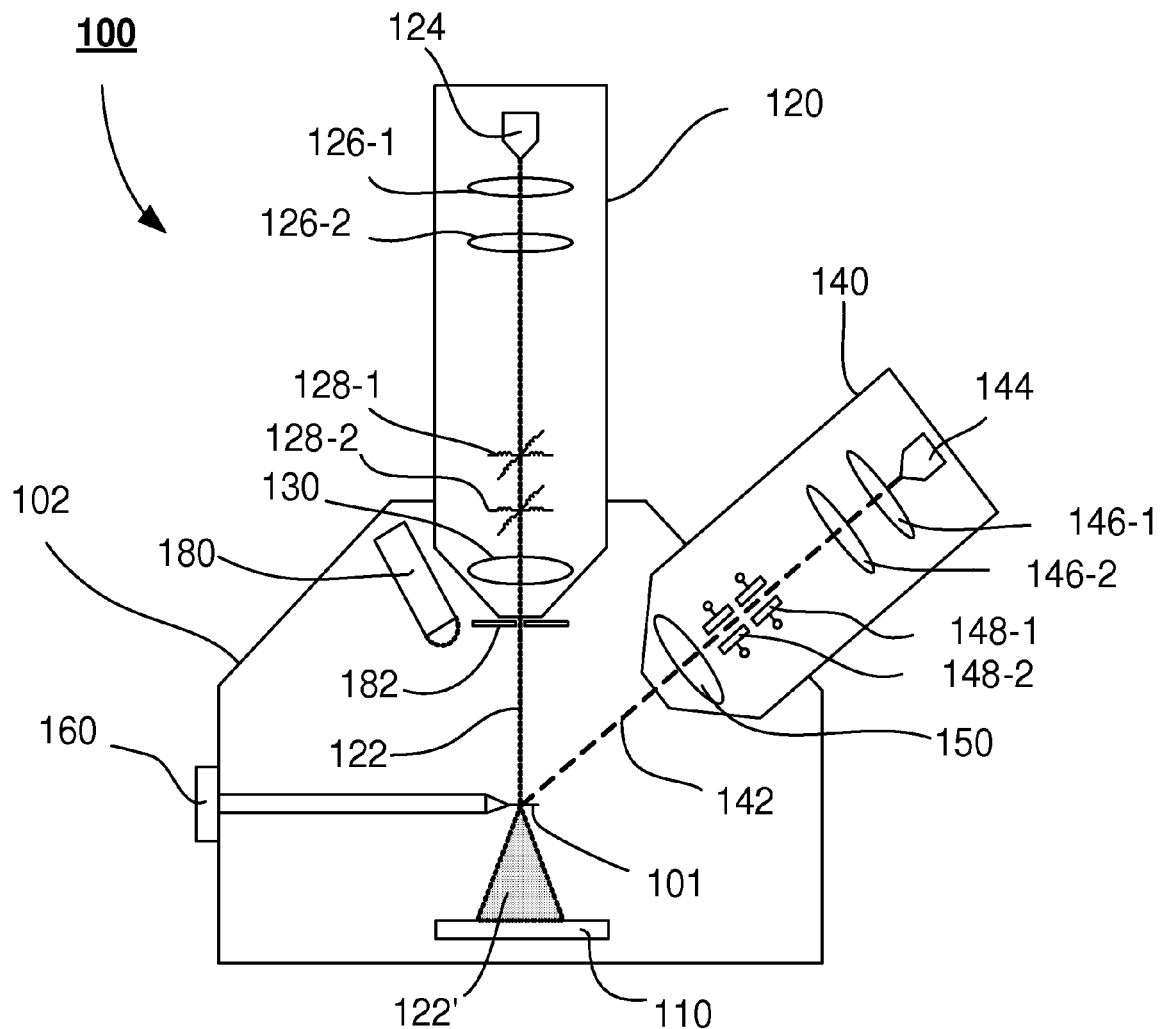
FIG. 1 schematically shows a particle-optical apparatus equipped for performing the method according to the invention.

On the sample chamber an electron beam column 120 producing an electron beam 122 is mounted. The electron beam column comprises an electron source 124, lenses 126-$i$ for manipulating the electron beam, deflectors 128-$i$ for deflecting and scanning the electron beam and an objective lens 130 for focusing the electron beam.

Likewise an ion beam column 140 producing an ion beam 142 is mounted on the sample chamber, the ion beam column comprising an ion source 144, lenses 146-$i$ for manipulating the ion beam, deflectors 148 for deflecting and scanning the ion beam and objective lens 150 for focusing the ion beam.

On the sample chamber a manipulator 160 is mounted. On this manipulator a sample 101 can be mounted (by clamping, beam induced deposition, electrostatic adhesion or the like) so that it can be positioned in the path of the electron beam.

It is noted that the manipulator may be equipped to be cooled to cryogenic temperature to accommodate cryogenic samples. The position where the sample resides may be surrounded by cryo-shields to prevent heating of the sample.

A camera 110 is placed in the sample chamber such that electrons transmitted through the sample 122' impinge on the camera. Typically this camera is a direct electron detector (preferably a CMOS camera), but also a fluorescent screen observed by a CCD or a CMOs camera via fiber optics or optical elements (lenses, mirrors) can be used.

The apparatus may further be equipped with other detectors, such as secondary electron detector 180 and backscatter detector 182, and for example a gas injection system (not shown) to admit gases into the sample chamber to enhance etching during sample preparation.

Remarks:
some parts, for example the camera, may be retractable to avoid damage when admitting gas and/or atmosphere to the sample chamber.
all parts (lenses, deflectors, detectors are controlled to a programmable controller of the apparatus, that is also equipped to process the signals of the detectors and display images on a display.

The deflector and lenses in an electron microscope column (110) are typically magnetic deflectors and lenses, while in an ion beam column typically comprises electrostatic deflectors and lenses.

Typically the apparatus generates at any moment in time either an electron beam or an ion beam, although it is known that both beams are used simultaneously.

Figure 2:
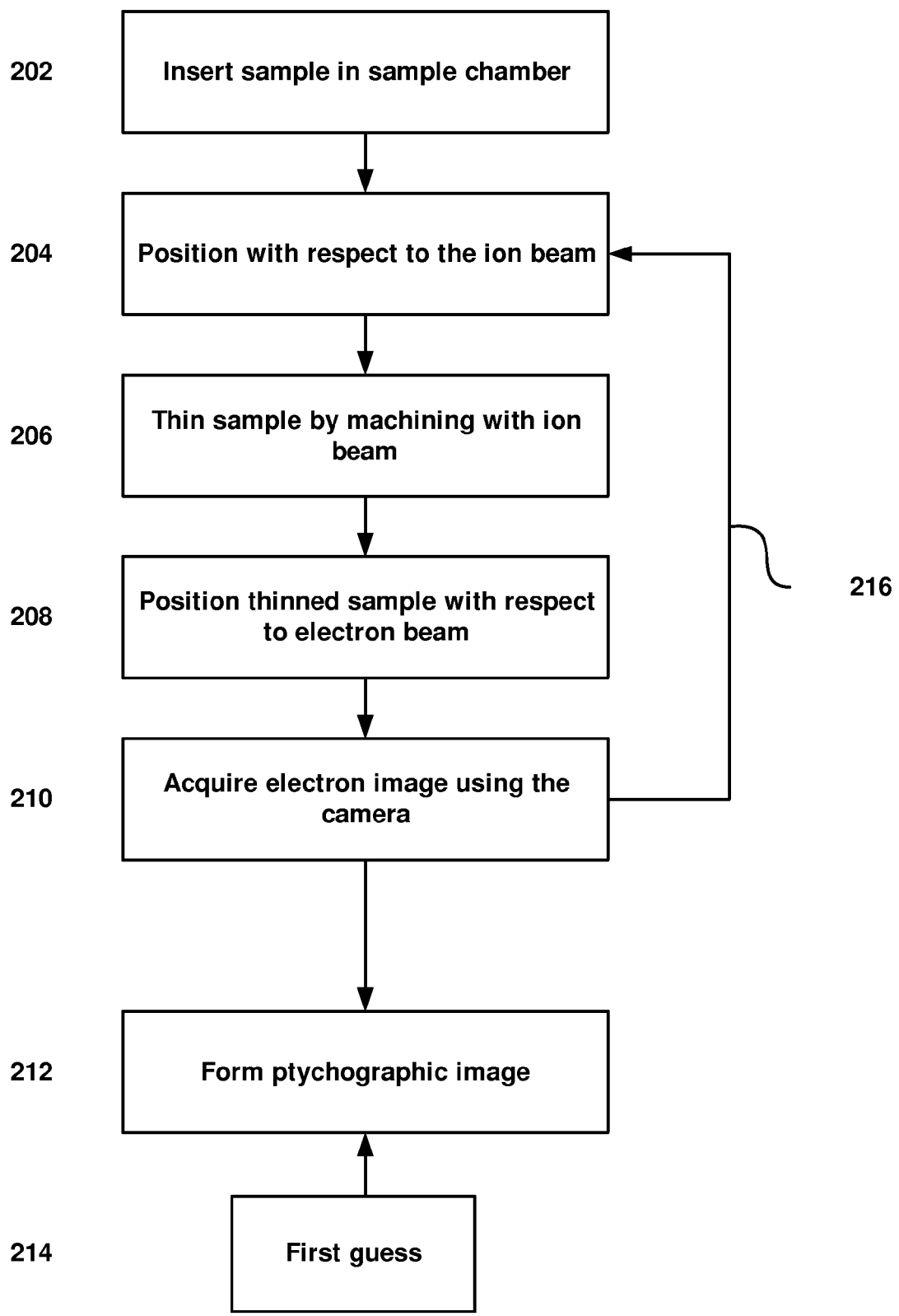
FIG. 2 shows the steps of an embodiment of the method according to the invention.

FIG. 2 schematically shows the steps according to an embodiment of the method according to the invention.

In step 202 a sample is inserted in the sample chamber of the apparatus. The sample may be part of a larger work piece, such as a wafer, or cryogenic biological tissue. In this case the sample should be excised by machining the work piece with the ion beam, and the sample can be attached to the manipulator by e.g. beam induced deposition.

Alternatively the sample can be inserted while already attached to a sample holder, for example a standard TEM grid, and the sample holder mechanically attached to the manipulator In step 204 the sample is positioned with respect to the ion beam, in preparation to step 206.

In step 206 the sample is thinned by machining the sample with the ion beam. This is typically done by scanning the ion beam over the sample in a glancing fashion. Gases may be admitted to the sample chamber to enhance the speed of machining.

In step 208 the thus thinned sample is positioned with respect to the electron beam. Typically this involves tilting of the sample so that the sample is repositioned to be perpendicular to the electron beam, but said tilting may be superfluous due to the relative tilt of electron column and ion column with respect to each other. The positioning may be augmented by imaging the sample by scanning the electron beam over the sample and using the signal of one of the auxiliary detectors, such as a backscatter detector 182. The area of interest to be imaged in the ptychographic image can thus be brought "in-line" with the electron beam In step 210 an electron image is formed using the camera. This image thus contains information of electrons transmitted through the sample, forming a diffraction pattern on the camera.

The camera typically is a CMOS camera directly detecting electrons impinging on it, such as the Falcon CMOS Direct Electron Detector, manufactured by FEI Co., Hillsboro (Oreg.), USA, or an optical camera (CMOS, CCD) that is coupled to a fluorescent screen via, for example, fibers, as identified by Humphry [-1-].

In step 212 a ptychographic image is formed using the electron image acquired in step 210 and using a first guess (a seed image) of the sample, as provided in 214. For a description of this process reference is made to U.S. Pat. No. 7,792, 246 B2, more specifically to its FIG. 7. The seed image may be a blank, but may be based on prior knowledge of the sample, such as an image acquired earlier from the same or a similar sample, or even an image formed from e.g. a CAD model of the part of a sample.

After obtaining a first electron image in step 210, the sample may be further machined by returning to step 204. A layer can then be removed in a repeated step 206, and a further electron image can be acquired in a repeated step 210.

The image obtained in the repeated step 210 may be used to form another ptychographic image. In that case preferably the earlier obtained ptychographic image, or one of its guesses, may be used as a seed image.

It is noted that, using the two ptychographic images, or using the two electron images, a ptychographic image of the removed layer can be formed.

As mentioned earlier, the phase information in the ptychographic image or images may be used to determine the (place dependent) internal potential of the sample. This is illustrated in e.g. FIG. 3b in Humphry [-1-]. Assuming that the composition of the sample is known, for example silicon with a dopant D, the concentration of the dopant D can be derived from the phase information.

By making tilt series, a 3D reconstruction of the sample can be obtained. Here as well the seed image can be obtained from another ptychographic image to reduce processing time.

We claim as follows:

1. A method of preparing and imaging a sample using a particle-optical apparatus, the particle-optical apparatus comprising:
   an electron column mounted on an evacuable sample chamber, the electron column equipped to produce a beam of electrons, the beam of electrons for irradiating the sample,
   a camera system for forming an electron image of the diffraction pattern caused by electrons transmitted through the sample, and
   a manipulator for positioning the sample in the sample chamber with respect to the beam of electrons,
   the method comprising the steps of:
      preparing the sample,
      positioning the sample in the sample chamber with respect to the beam of electrons,
      forming an electron image on the camera system using the electron column, and
      deriving a first ptychographic image of the sample from said first electron image, the ptychographic image the result of an iterative converging process in which estimates of the sample are formed,
   wherein:
      the particle-optical apparatus comprises a focused ion beam column mounted on the sample chamber for producing a focused ion beam, the focused ion beam for machining the sample,
      preparing the sample involves positioning the sample with respect to the ion beam and thinning the sample using the focused ion beam,
      after forming the first image, a layer of the sample is removed using the ion beam, after which a second electron image is formed using the electron column, and
      a second ptychographic image of the sample is derived using the second electron image, and
      the sample is kept under vacuum at least from the moment that the sample is prepared by thinning the sample with the focused ion beam until the moment that the second electron image is taken.

2. The method of claim 1 in which the first ptychographic image or one of the guesses in the iterative process for forming the first ptychographic image other than the first guess is used as a seed image for the reconstruction of the second ptychographic image, thereby shortening the throughput time needed for forming the second ptychographic image from the second electron image.

3. The method of claim 1 in which a computer generated image is used as a seed image for the reconstruction of the second ptychographic image, thereby shortening the throughput time needed for forming the second ptychographic image from the second electron image.

4. The method of claim 1 in which a reconstructed image of the removed layer using the first and second ptychographic images or using the first and second electron images form a ptychographic image of said removed layer.

5. The method of claim 1 in which one of the images is used to determine the place dependent phase shift in the lamella and derive from that the inner potential of the lamella as a function of the position, followed by the step of deriving dopant concentrations.

6. The method of claim 1 in which the second image is used to determine an end-pointing decision.

7. The method of claim 1 in which the ion beam is a focused ion beam that can be scanned over the sample.

8. The method of claim 1 in which the material of the lamella is a semiconductor material, a crystalline material, a polycrystalline material, or a biological material at a cryogenic temperature.

9. The method of claim 1 in which the method further comprises forming multiple images of the lamella using ptychographic reconstruction, the multiple images formed with the lamella in a different orientation with respect to the electron beam, followed by the reconstruction of a tomogram of the lamella.

10. The method of claim 1 further comprising preventing heating of the sample by cooling the micromanipulator to a cryogenic temperature and/or surrounding the position where the sample resides with cryo-shields.

11. The method of claim 1 in which the camera system comprises a direct electron detector or an optical camera coupled to a fluorescent screen.

12. The method of claim 1 in which the camera system is retractable to avoid damage that may be caused from the admittance of gas and/or atmosphere to the sample chamber.

13. The method of claim 1 in which the resolution of the ptychographic images are less than 1.2 nm.

14. The method of claim 1 in which after forming the first image, a layer of the sample is removed using the ion beam, after which a second electron image is formed using the electron column is performed without exposing the sample to air or without exposing the sample to a more inert atmosphere.

15. The method of claim 1 in which thinning the sample or removing a layer from the sample after forming the first image comprises producing a sample thinner than 20 nm.

16. The method of claim 4 in which the removed layer is less than 5 nm in thickness.

17. The method of claim 7 in which the focused ion beam is a beam that does not leave implanted atoms.

18. The method of claim 1 in which the sample is attached to the manipulator by beam induced deposition.

19. The method of claim 1 in which the sample is attached to a sample holder and the sample holder is mechanically attached to the micromanipulator.

20. The method of claim 19 in which the sample holder comprises a TEM grid.

\* \* \* \* \*